(12) United States Patent
Lee et al.

(10) Patent No.: US 12,557,318 B2
(45) Date of Patent: Feb. 17, 2026

(54) SEMICONDUCTOR STRUCTURE AND METHOD OF FORMING THEREOF

(71) Applicant: Hon Young Semiconductor Corporation, Hsinchu (TW)

(72) Inventors: Yu-Tsu Lee, Hsinchu (TW); Yan-Ru Chen, Hsinchu (TW); Liang-Ming Liu, Hsinchu (TW); Kuang-Hao Chiang, Hsinchu (TW)

(73) Assignee: Hon Young Semiconductor Corporation, Hsinchu (TW)

( * ) Notice: Subject to any disclaimer, the term of this patent is extended or adjusted under 35 U.S.C. 154(b) by 401 days.

(21) Appl. No.: 18/170,545

(22) Filed: Feb. 17, 2023

(65) Prior Publication Data

US 2024/0120411 A1    Apr. 11, 2024

(30) Foreign Application Priority Data

Oct. 11, 2022   (TW) .................................. 111138459

(51) Int. Cl.
| | | |
|---|---|---|
| *H10D 30/01* | (2025.01) | |
| *H10D 30/66* | (2025.01) | |
| *H10D 30/83* | (2025.01) | |
| *H10D 62/10* | (2025.01) | |
| *H10D 62/13* | (2025.01) | |
| *H10D 62/832* | (2025.01) | |
| *H10D 64/23* | (2025.01) | |

(52) U.S. Cl.
CPC ....... *H10D 30/0515* (2025.01); *H10D 30/831* (2025.01); *H10D 62/151* (2025.01); *H10D 62/8325* (2025.01)

(58) Field of Classification Search
CPC ............. H10D 30/0515; H10D 30/831; H10D 62/151; H10D 62/8325; H10D 12/031; H10D 30/668; H10D 64/256; H10D 62/117

See application file for complete search history.

(56) References Cited

U.S. PATENT DOCUMENTS

| | | | | |
|---|---|---|---|---|
| 2004/0033638 | A1* | 2/2004 | Bader | H10H 20/018 257/E33.068 |
| 2007/0210316 | A1* | 9/2007 | Yonezawa | H10D 62/117 257/77 |

(Continued)

FOREIGN PATENT DOCUMENTS

| | | |
|---|---|---|
| CN | 103703566 B | 5/2017 |
| TW | 202044594 A | 12/2020 |

*Primary Examiner* — Herve-Louis Y Assouman
(74) *Attorney, Agent, or Firm* — CKC & Partners Co., LLC

(57) ABSTRACT

A method of forming a semiconductor structure includes the following operations. A semiconductor epitaxial layer is formed on a first semiconductor substrate. A first side of the semiconductor epitaxial layer is adhered to a transfer substrate by an adhesive layer covering the first side of the semiconductor epitaxial layer. The semiconductor epitaxial layer and the first semiconductor substrate are turned over by the transfer substrate. The first semiconductor substrate is removed to expose a second side of the semiconductor epitaxial layer opposite to the first side. A first semiconductor doped region is formed on the second side of the semiconductor epitaxial layer. After the first semiconductor doped region is formed, the adhesive layer and the transfer substrate are removed.

13 Claims, 17 Drawing Sheets

(56) References Cited

U.S. PATENT DOCUMENTS

| | | | |
|---|---|---|---|
| 2008/0230787 A1* | 9/2008 | Suzuki | H10D 62/107 |
| | | | 257/E29.066 |
| 2016/0197149 A1* | 7/2016 | Sakai | H10D 8/60 |
| | | | 257/77 |
| 2017/0323919 A1* | 11/2017 | Kumar | H10F 39/809 |
| 2019/0326330 A1* | 10/2019 | Xia | H10H 29/142 |
| 2020/0303494 A1 | 9/2020 | Shimizu | |

* cited by examiner

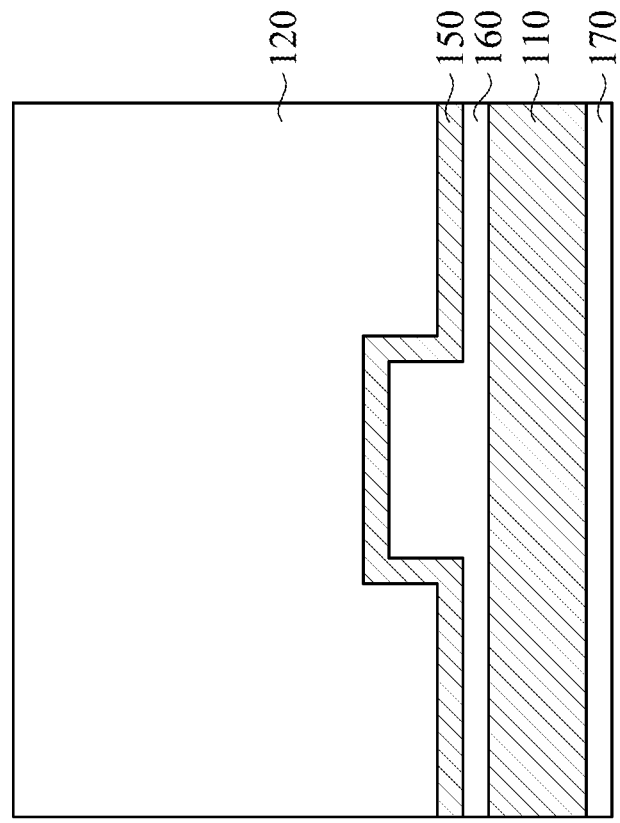
Fig. 15
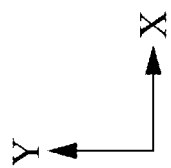

SEMICONDUCTOR STRUCTURE AND METHOD OF FORMING THEREOF

RELATED APPLICATIONS

This application claims priority to Taiwan Application Serial Number 111138459, filed Oct. 11, 2022, which is herein incorporated by reference in its entirety.

BACKGROUND

Field of Invention

The present disclosure relates to semiconductor structure and method of forming semiconductor structures.

Description of Related Art

In the field of semiconductor technology, vertical junction field-effect transistors can be used as power components. How to reduce an equivalent on-resistance between the source and the drain in a vertical junction field-effect transistor is one of the problems that technicians in this field want to solve. However, in many technical solutions to reduce the on-resistance of ae transistor, the voltage resistance for the transistor is also reduced at the same time. It leads to the unintended current path and unintended leakage currents are generated. In addition, many of the technical solutions to reduce the on-resistance of the transistor may also increase the volume occupied by the transistor in the space.

Therefore, those in the industry are endeavoring to find a solution that can reduce the on-resistance of transistors and effectively avoid the expected leakage current without increasing the volume of transistors in the space.

SUMMARY

An aspect of the present disclosure is related to a method of forming a semiconductor structure.

According to one or more embodiments of the present disclosure, a method of forming a semiconductor structure includes a number of operations. A semiconductor epitaxial layer is formed on a first semiconductor substrate. An adhesive layer is formed to cover a first side of the semiconductor epitaxial layer. The first side of the semiconductor epitaxial layer is fixed on a transfer substrate by the adhesive layer covering the first side of the semiconductor epitaxial layer. The semiconductor epitaxial layer and the first semiconductor substrate are flipped. The first semiconductor substrate is removed to expose a second side of the semiconductor epitaxial layer opposite to the first side. A first doped region is formed on the second side of the semiconductor epitaxial layer. The adhesive layer and the transfer substrate are removed after the first doped region is formed.

In one or more embodiments of the present disclosure, the method further includes before the adhesive layer covering the first side of the semiconductor epitaxial layer is formed or after the adhesive layer and the transfer substrate is removed, forming a second doped region on the first side of the semiconductor epitaxial layer.

In one or more embodiments of the present disclosure, the method further includes forming a first recess on the first side of the semiconductor epitaxial layer, forming a second doped region on the first side of the semiconductor epitaxial layer outside the first recess and forming a gate structure in the first recess, wherein the first doped region, the gate structure and the second doped region form a transistor.

In some embodiments, the method further includes forming a second recess recessed from the second side of the semiconductor epitaxial layer and aligned with the first recess and forming the first doped region in the second recess.

In some embodiments, the method further includes filling a conductive layer in the second recess, connecting a second semiconductor substrate to the conductive layer and forming a metal layer on the second semiconductor substrate.

In one or more embodiments of the present disclosure, the method further includes forming a second doped region on the first side of the semiconductor epitaxial layer, forming a first electrode on the first doped region and forming a second electrode on the second doped region before the adhesive layer covering the first side of the semiconductor epitaxial layer is formed or after the adhesive layer and the transfer substrate is removed.

An aspect of the present disclosure is related to forming a semiconductor structure.

According to one or more embodiments of the present disclosure, a method of forming a semiconductor structure includes a number of operations. A semiconductor epitaxial layer is formed on a first semiconductor substrate. A first recess is formed on a first side of the semiconductor epitaxial layer. A gate structure is formed in the first recess of the semiconductor epitaxial layer. A first source/drain doped region is formed on the first side of the semiconductor epitaxial layer outside the first recess. An adhesive layer is formed to cover a first side of the semiconductor epitaxial layer. The first side of the semiconductor epitaxial layer is fixed on a transfer substrate by the adhesive layer. The semiconductor epitaxial layer and the first semiconductor substrate are flipped. The first semiconductor substrate is removed to expose a second side of the semiconductor epitaxial layer opposite of the first side. A second recess recessed from the second side of the semiconductor epitaxial layer and aligned with the gate structure is formed. A second source/drain doped region is formed in the second recess aligned with the gate structure, wherein the first source/drain doped region, the gate structure and the second source/drain doped region form a transistor. The adhesive layer and the transfer substrate are removed after the transistor is formed.

In one or more embodiments of the present disclosure, the method further includes forming an electrode layer covering the second source/drain doped region before the transfer substrate is removed.

In one or more embodiments of the present disclosure, the method further includes filling a conductive layer in the second recess, connecting a second semiconductor substrate to the conductive layer and forming a metal layer on the second semiconductor substrate.

In one or more embodiments of the present disclosure, the method further includes forming an electrode on the first source/drain doped region, wherein forming the adhesive layer includes the electrode is covered by the adhesive layer before the adhesive layer is formed.

In one or more embodiments of the present disclosure, the method further includes forming an electrode on the first source/drain doped region before the transfer substrate is removed.

In one or more embodiments of the present disclosure, the method further includes forming another first source/drain doped region on the first side of the semiconductor epitaxial layer, wherein the two first source/drain doped regions are respectively formed on two opposite sidewalls of the first recess.

In one or more embodiments of the present disclosure, forming the first source/drain doped region includes a number of operations. A semiconductor well is formed on the first side of the semiconductor epitaxial layer outside the first recess. A first sub-doped region with a first semiconductor type and a second sub-doped region with a second semiconductor type are formed in the semiconductor well, wherein the first semiconductor type is different from the second semiconductor type.

In one or more embodiments of the present disclosure, the first semiconductor substrate is a silicon carbide substrate, and the transfer substrate is a sapphire substrate.

An aspect of the present disclosure is related to a semiconductor structure.

According to one or more embodiments of the present disclosure, a semiconductor structure includes a semiconductor substrate, a semiconductor epitaxial layer, a first recess, a gate structure, a first source/drain doped region, a second recess and a second source/drain doped region. The semiconductor epitaxial layer includes a first side and a second side opposite to the first side. The second side of the semiconductor epitaxial layer is connected to the semiconductor substrate. The first recess is recessed from the first side of the semiconductor epitaxial layer. The gate structure is located in the first recess. The first source/drain doped region is located on the first side of the semiconductor epitaxial layer and is contact with the gate structure. The second recess is recessed from the second side of the semiconductor epitaxial layer. The second recess is aligned with the first recess. The second source/drain doped region is located in the second recess.

In one or more embodiments of the present disclosure, the semiconductor structure further includes an electrode. The electrode is located on the first source/drain doped region of the first side of the semiconductor epitaxial layer.

In one or more embodiments of the present disclosure, the first source/drain doped region further includes a semiconductor well, a first sub-doped region and a second sub-doped region. The semiconductor well is located on the first side of the semiconductor epitaxial layer outside the first recess. The first sub-doped region and the second sub-doped region are located in the semiconductor well and respectively have a first semiconductor type and a second semiconductor type. The first semiconductor type is different from the second semiconductor type. One of the first sub-doped region and the second sub-doped region is contact with the gate structure.

In some embodiments, the semiconductor structure further includes another first source/drain doped region located on the first side of the semiconductor epitaxial layer. The two first source/drain doped regions are respectively located on two opposite sidewalls of the first recess.

In one or more embodiments of the present disclosure, the semiconductor structure further includes a conductive layer and a metal layer. The conductive layer is connected between the second source/drain doped region and the semiconductor substrate. The conductive layer is filled with the second recess. The metal layer is located below the semiconductor substrate. The semiconductor substrate is located between the semiconductor epitaxial layer and the metal layer.

In one or more embodiments of the present disclosure, the semiconductor substrate is a silicon carbide substrate.

In summary, the on-resistances of the transistors in the semiconductor structure can be reduced without changing the voltage resistance of the rest of the semiconductor structure. By using a transfer substrate in the semiconductor process, it is possible to flexibly perform the semiconductor process on the front and back sides of the semiconductor epitaxial layer to form the structure to be required.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIGS. 14-16 schematically illustrate cross-section views of one or more middle operations of forming a semiconductor structure according to one or more embodiment of the present disclosure.

DETAILED DESCRIPTION

Figure 1:
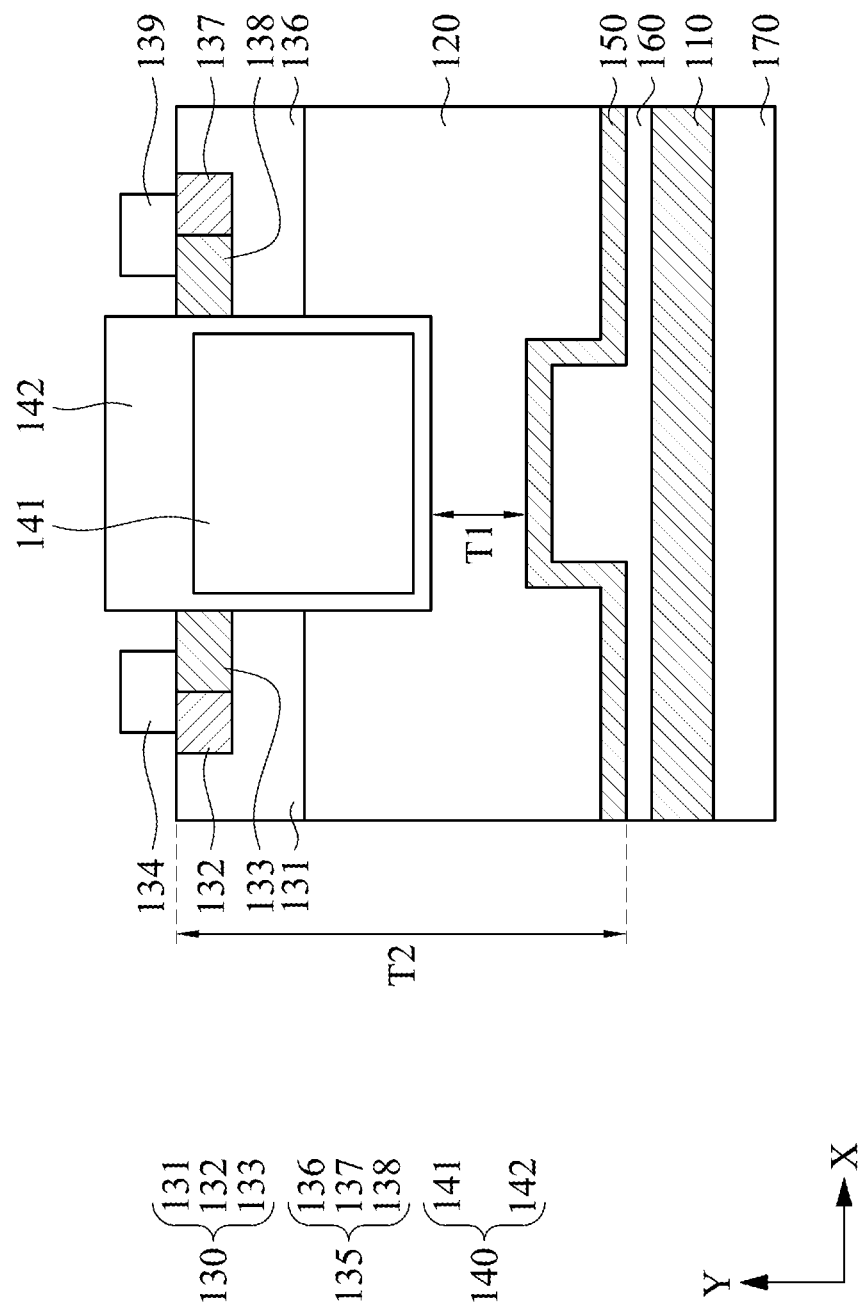
FIG. 1 illustrates a schematic cross-section view of a semiconductor structure according one or more embodiments of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Reference is made to FIG. 1. FIG. 1 illustrates a schematic cross-section view of a semiconductor structure 100 according one or more embodiments of the present disclosure.

As shown in FIG. 1, in one or more embodiments of the present disclosure, the semiconductor structure 100 includes a substrate 110, a semiconductor epitaxial layer 120, a doped region 130, a doped region 135, a gate structure 140, a doped region 150, a conductive layer 160 and an electrode 170. The semiconductor epitaxial layer 120 includes a front side and a back side opposite to the front side. The doped region 130, the doped region 135 and the gate structure 140 are formed on the front side of the semiconductor epitaxial layer 120. The doped region 150 is formed on the back side of the semiconductor epitaxial layer 120. In some embodiments, the doped region 130, the doped region 135 and the doped region 150 may be formed by performing a semiconductor doping process on the front side and the back side of the semiconductor epitaxial layer 120.

In one or more embodiments of the present disclosure, the doped region 130, the gate structure 140, and the doped region 150 may form a transistor. The doped region 135, the gate structure 140, and the doped region 150 may form another transistor. For example, the doped region 130 or the doped region 135 can be used as sources of the transistors, doped region 150 may be used as a drain of the transistors, and the gate structure 140 may be used as the gate of the transistor to control current between the sources and the drain of the transistors. The semiconductor epitaxial layer 120 can be used as a carrier drift layer for carriers of the transistor to flow to form a current path.

In this embodiment, the doped region 130 includes a semiconductor well 131. The semiconductor epitaxial layer 120 has a first semiconductor type. The semiconductor well 131 of the semiconductor well 131 of the doped region 130 has a second semiconductor type that is different from the first semiconductor type. For example, but without limitation, the semiconductor epitaxial layer 120 has a first semiconductor type of n-type doping and the semiconductor well 131 has a second semiconductor type of p-type doping. Further, the doped region 130 includes a sub-doped region 132 and a sub-doped region 133 formed within the semiconductor well 131. In this embodiment, the sub-doped region 132 has a second semiconductor type and the doping concentration of the sub-doped region 132 is greater than the doping concentration of the semiconductor well 131, and the sub-doped region 132 can be considered to have a heavily p-type doping (i.e., $p^+$-doping). The sub-doped region 133 has a first semiconductor type, the doping concentration of the sub-doped region 133 is greater than the doping concentration of the semiconductor epitaxial layer 120, and the sub-doped region 133 may be considered to have a heavily n-type doping (i.e., $n^+$-doping).

As shown in FIG. 1, in this embodiment, the gate structure 140 is directly contact with the sub-doped region 133 and the semiconductor well 131 outside the sub-doped region 133. The gate structure 140 extends into the semiconductor epitaxial layer 120. The bottom surface of the gate structure 140 is lower than the bottom surface of the semiconductor well 131. The gate structure 140 includes an oxide layer 142 and a conductive layer 141. The oxide layer 142 of the gate structure 140 is used to insulate the conductive layer 141 from the sub-doped region 133. The conductive layer 141 is, for example, a polycrystalline (poly) semiconductor material that can perform the operation of the gate structure 140 by conducting electricity to control the transistors formed by the doped region 130, the gate structure 140 and the doped region 150. In some embodiments, the conductive layer 141 may be a gate metal layer.

The doped region 150 is located on the back side of the semiconductor epitaxial layer 120 and has a first semiconductor type. In this embodiment, the doped region 150 has a great $n^+$-type doping concentration. The doped region 150 has a doping concentration greater than the doping concentration of the semiconductor epitaxial layer 120. As shown in FIG. 1, the back side of the semiconductor epitaxial layer 120 has a recess recessed toward the gate structure 140. The doped region 150 is formed conformally on the back side of the semiconductor epitaxial layer 120 having a recess. The doped region 150 has a length T1 between the top surface of the doped region 150 and the bottom surface of the gate structure 140, and the thickness of the semiconductor epitaxial layer 120 in the direction Y corresponds to a length T2. The length T1 is less than the length T2 of the overall semiconductor epitaxial layer 120. By reducing the length T1 between the top surface of the doped region 150 and the bottom surface of the gate structure 140, it is possible to effectively reduce conduction current of the transistor without significantly altering the voltage resistance of the rest of the transistor.

In this embodiment, the sub-doped region 133 of the source has a heavily $n^+$-type doping, the well 131 has a p-type doping, the semiconductor epitaxial layer 120 has an n-type doping, and the doped region 150 has a heavily $n^+$-type doping. It allows that the source sub-doped region 133, the well 131 and the semiconductor epitaxial layer 120 form an n-p-n structure with doped region 150. The gate structure 140 overlays the p-type well 131 of the n-p-n structure to control the movement of carriers from the sub-doped region 133 through the well 131 to the semiconductor epitaxial layer 120. The carriers may move through the semiconductor epitaxial layer 120 to the doped region 150.

In FIG. 1, the semiconductor structure 100 further includes an electrode 134. The sub-doped region 132 and the sub-doped region 133 are covered by the electrode 134. In this embodiment, the electrodes 134 may be used as an electrode for the source of the transistor.

The substrate 110 is connected to the doped region 150 by the conductive layer 160. The substrate 110 has the first semiconductor type of the sub-doped region 133, and the substrate 110 has heavily doping. In this embodiment, the substrate 110 has heavily $n^+$-type doping. Both of the doped region 150 and the substrate 110 can be regarded as the drain structure of the transistor. The electrode 170 is formed below the substrate 110 and can be regarded as a drain electrode of the drain structure.

In some embodiment, material of the conductive layer 160 and the electrode 170 can be conductive metal material.

Therefore, the operation of the transistor formed in the semiconductor structure 100 can be performed by the conductive layer 141 of the gate structure 140. For example, once a voltage is applied to the conductive layer 141 of the gate structure 140 in some embodiments and suitable biases are applied to the electrode 134 and the electrode 170 respectively, electrons regarded as carriers moves from the electrode 134 to the sub-doped region 133. Then, the electrons moves to the semiconductor epitaxial layer 120 through the well 131 with formed channel. After passing through the semiconductor epitaxial layer 120, the electrons reach the drain structure formed by the doped region 150 and the substrate 110 and flow out from the electrode 170, which is connected to the substrate 110 and used as the drain electrode.

In such current path, an equivalent conduction resistance of the transistor formed by the doped region 130, the semiconductor epitaxial layer 120, the gate structure 140 and the drain structure between the source and the drain can be considered to consist of one or more equivalent resistances in series as follow: the resistance of the electrode 134, the resistance of the conduction channel of the well 131 between the sub-doped region 133 and the semiconductor epitaxial layer 120, the equivalent resistance of the carriers moving in the semiconductor epitaxial layer 120, the equivalent resistances of the carriers passing through the doped region 150, the conductive layer 160 and the substrate 110 of the drain structure and the resistances of the electrode 170.

In this embodiment, by reducing a length T1 between a bottom surface of the gate structure 140 and the top surface of the doped region, a distance that the carriers need to move in the semiconductor epitaxial layer 120 can be significantly reduced, and the equivalent resistance of the carriers moving in the semiconductor epitaxial layer 120 can be reduced. Therefore, the on-resistance of the vertical transistor structure formed by the doped region 130, the gate structure 140 and the doped region 150 in the semiconductor structure 100 can be significantly reduced, and such a structure would not affect the ability of the semiconductor structure 100 to withstand the voltage at other locations in the semiconductor structure 100, thus avoiding leakage currents due to unintended conduction at other locations in the semiconductor structure 100.

As shown in FIG. 1, the doped region 130 and the doped region 135 are located on opposite sides of the gate structure 140 in the direction X, respectively. The doped region 135, the gate structure 140, and the doped region 150 may form another vertical transistor structure. In the embodiment illustrated in FIG. 1, similar to doped region 130, the doped region 135 includes a well 136 of the first semiconductor type, a sub-doped region 137 with a strong first semiconductor type doping and a sub-doped region 138 with a strong second semiconductor type doping that is different from the first semiconductor type.

In details, the well 136 may have p-type doping, the sub-doped region 137 has a heavily $p^+$-type doping and the sub-doped region 138 has a heavily $n^+$-type doping. The gate structure 140 directly contacts the well 136 outside the sub-doped region 137 and the sub-doped region 138. The sub-doped region 138, the well 136, the doped region 150 and the substrate 110 form an n-p-n structure and the p-typed doped well 136 is in contact with the gate structure 140.

Therefore, the doped region 130 and the doped region 135 can share the same gate structure 140, the same semiconductor epitaxial layer 120, the same doped region 150 and the same substrate 110. By reducing the length T1 between the bottom surface of the gate structure 140 and the top surface of the doped region 150, the distance that the carriers need to travel in the semiconductor epitaxial layer 120 can also be significantly reduced, thus reducing the conduction resistance between the source and the drain electrodes of the other vertical transistor structure formed by the doped region 135, the gate structure 140 and the doped region 150.

In FIG. 1, the semiconductor structure 100 further includes an electrode 139. The electrode 139 is located over the sub-doped region 137 and the sub-doped region 138. In this embodiment, the electrode 134 may be used as the electrode of the source.

The sub-doped region 132 and the sub-doped region 137 of the second semiconductor type can be used to surround the sub-doped region 133, the sub-doped region 138 and the gate structure 140 in the horizontal direction X to avoid creating an unintended current path in the horizontal direction X. Therefore, it can ensure that the carriers from the sub-doped region 133 and the sub-doped region 138 flow into the semiconductor epitaxial layer 120 along the gate structure 140.

In some embodiments, the length T2 corresponding to the thickness of the semiconductor epitaxial layer 120 in the direction Z may be less than or equal to 30 μm to further increase the voltage resistance of the semiconductor structure 100. For example, in some embodiments, the length T1 between the bottom surface of the gate structure 140 and the top surface of the doped region 150 may be in a range between 1 μm and 4 μm. The length T1 between the bottom surface of the gate structure 140 and the top surface of the doped region 150 is less than the length T2, which corresponds to the thickness of the semiconductor epitaxial layer 120. The thickness of the semiconductor epitaxial layer 120 between the bottom surface of the gate structure 140 and the top surface of the doped region 150 is reduced, so that the equivalent on-resistance of the transistor in the semiconductor structure 100 is reduced without depleting the voltage resistance of the semiconductor structure 100 at other locations.

In one or more embodiments of the present disclosure, the material of the semiconductor epitaxial layer 120 and the substrate 110 may be silicon carbide (SiC). In one or more embodiments, the semiconductor epitaxial layer 120 and substrate 110 may use silicon or other suitable semiconductor materials.

Reference is made to FIGS. 2-13 to further illustrate the formation of the semiconductor structure 100. FIGS. 2-13 schematically illustrate cross-section views of one or more middle operations of forming a semiconductor structure 100 according to one or more embodiment of the present disclosure.

Figure 2:
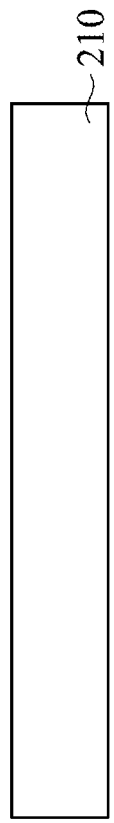
FIGS. 2-13 schematically illustrate cross-section views of one or more middle operations of forming a semiconductor structure according to one or more embodiment of the present disclosure.

In the schematic cross-sectional view illustrated in FIG. 2, a semiconductor substrate 210 is provided. In some embodiments, the material of the substrate 210 is, for example, silicon carbide. In some embodiments, the material of substrate 210 may be silicon or other suitable semiconductor material.

Figure 3:
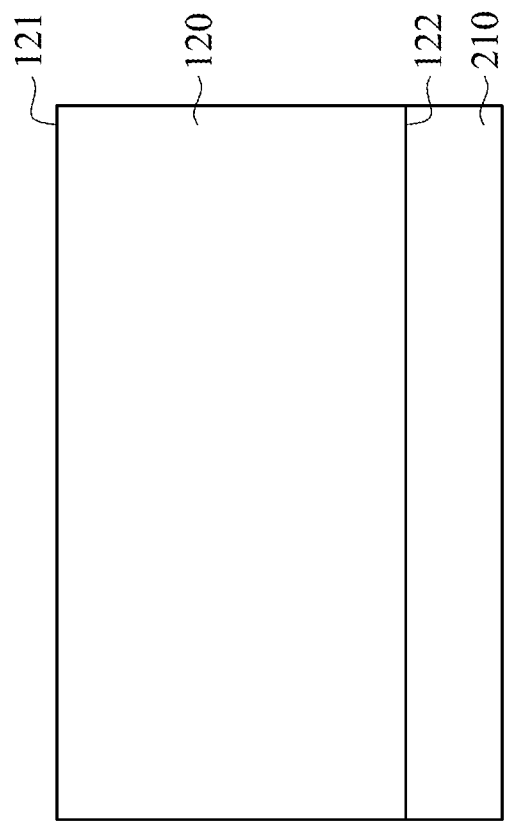
Figure 3:
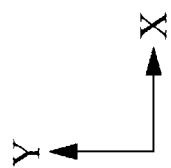

Following FIG. 2, in FIG. 3, a semiconductor epitaxial layer 120 is formed on a substrate 210. In the schematic cross-sectional view illustrated in FIG. 3, the semiconductor epitaxial layer 120 includes a front side (i.e., first side 121) and a back side (i.e., second side 122) that are opposite in direction Y. That is, the second side 122 is opposite to the first side in the vertical direction Y. The second side 122 of the semiconductor epitaxial layer 120 is connected to the substrate 210. The second side 122 of the semiconductor epitaxial layer 120 is connected to the substrate 210. As shown in FIG. 3, the second side 122 of the semiconductor epitaxial layer 120 is in direct contact with the top surface of the substrate 210.

In one or more embodiments of the present disclosure, the semiconductor epitaxial layer 120 may be formed on top of the substrate 210 by a semiconductor deposition process. In some embodiments, the semiconductor deposition process includes, but is not limited to, physical vapor deposition (PVD), chemical vapor deposition (CVD) or atomic layer deposition (ALD).

In one or more embodiments of the present disclosure, the semiconductor epitaxial layer 120 may have a first semiconductor type. In this embodiment, the semiconductor epitaxial layer 120 may be a silicon carbide semiconductor layer doped to have n-type doping.

Figure 4:
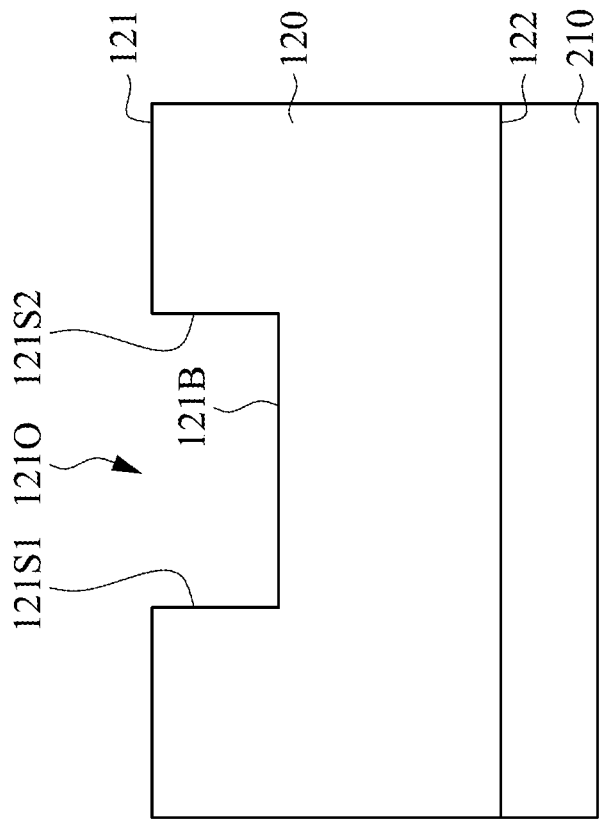

Reference is made to both FIG. 3 and FIG. 4. In the schematic cross-sectional view illustrated in FIG. 4, a recess 121O is formed in the first side 121 of the semiconductor epitaxial layer 120. As shown in FIG. 4, the recess 121O includes a bottom surface 121B and opposite sidewalls 121S1 and 121S2. The bottom surface 121B connects the sidewall 121S1 to the sidewall 121S2.

Figure 5:
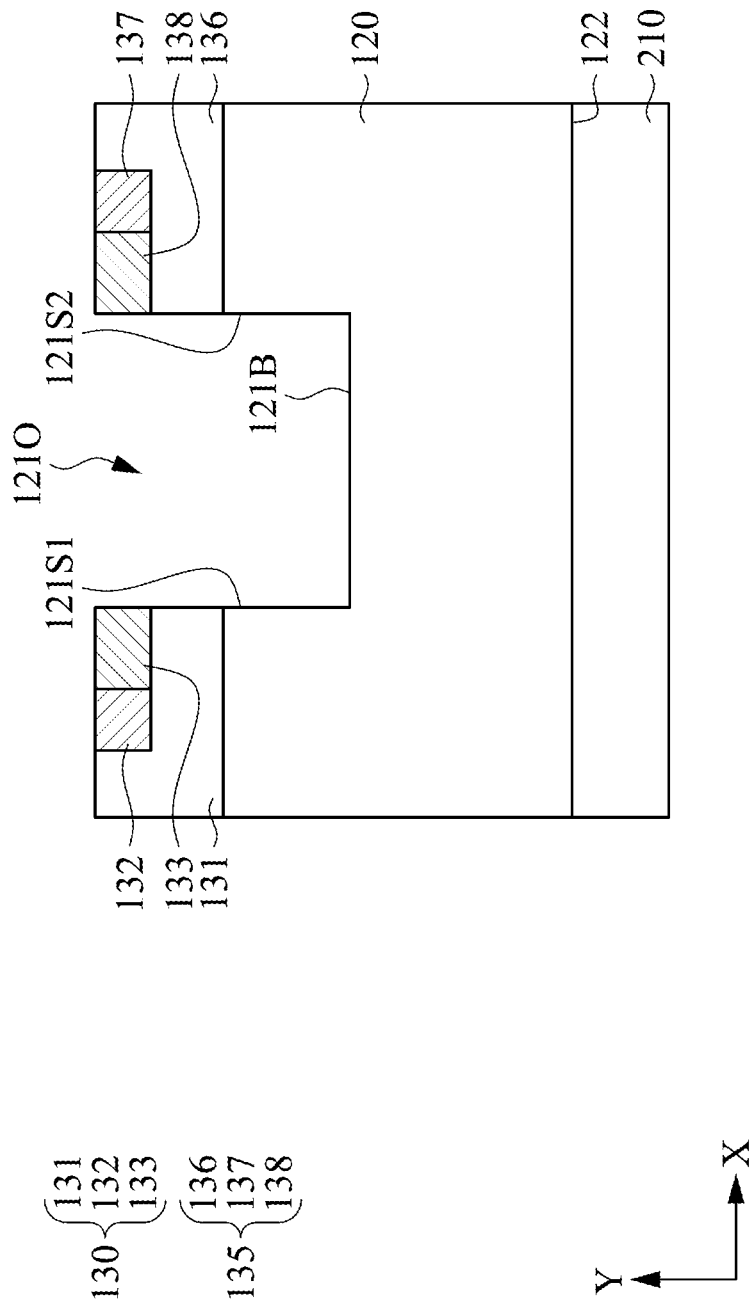

Following FIG. 4, in the schematic cross-sectional view illustrated in FIG. 5, a doping process is performed to form the doped region 130 and the doped region 135 on the first side 121 of the semiconductor epitaxial layer 120. The doped region 130 and the doped region 135 are formed on the upper part of the sidewall 121S1 and the sidewall 121S2 opposite the recess 121O, respectively, and the doped region 130 and the doped region 135 do not extend to the bottom of the recess 121O. In some embodiments, it is possible to first fill the recess 121O with the mask material and then perform a doping process to form the doped region 130 and the doped region 135, and then remove the mask material filled in the recess 121O after the doped region 130 and the doped region 135 are formed.

As shown in FIG. 5, the formed doped region 130 includes a well 131, a sub-doped region 132 and a sub-doped region 133. The well 131 is formed on the first side 121 of the semiconductor epitaxial layer 120 by a doping process and is adjacent to the sidewall 121S1. The well 131 has a second semiconductor type different from the first semiconductor type of the semiconductor epitaxial layer 120. In this embodiment, the well 131 has p-type doping. The bottom of well 131 is higher than the bottom 121B of the recess 121O in the vertical direction Y.

After the well 131 is formed, a further doping process is performed to form sub-doped region 132 and sub-doped region 133 in well 131. The sub-doped region 132 has the second semiconductor type. In this embodiment, a doping concentration of the sub-doped region 132 is greater than the doping concentration of the well 131, and the sub-doped region 132 can be regarded to have a great $p^+$-doping concentration. The sub-doped region 133 has the first semiconductor type. In this embodiment, sub-doped region 133 has heavily $n^+$-doping than the semiconductor epitaxial layer 120.

Similarly, as shown in FIG. 5, the well 136 of another doped region 135 is formed on a first side 121 of semiconductor epitaxial layer 120 and adjacent to sidewall 121S2. The well 136 has a second semiconductor type different from the first semiconductor type of semiconductor epitaxial layer 120. In this embodiment, the well 136 has a p-type doping. The bottom of the well 136 is higher than the bottom 121B of the recess 121O in the vertical direction Y.

In some embodiments, after the well 136 is formed, a doping process is further performed to form sub-doped region 137 and sub-doped region 138 in well 136. The sub-doped region 137 has the second semiconductor type. In this embodiment, the sub-doped region 137 has a heavily $p^+$-doping with respect to the well 136. The sub-doped region 138 has the first semiconductor type. In this embodiment, the sub-doped region 138 has a greater $n^+$-type doping concentration than the semiconductor epitaxial layer 120.

Figure 6:
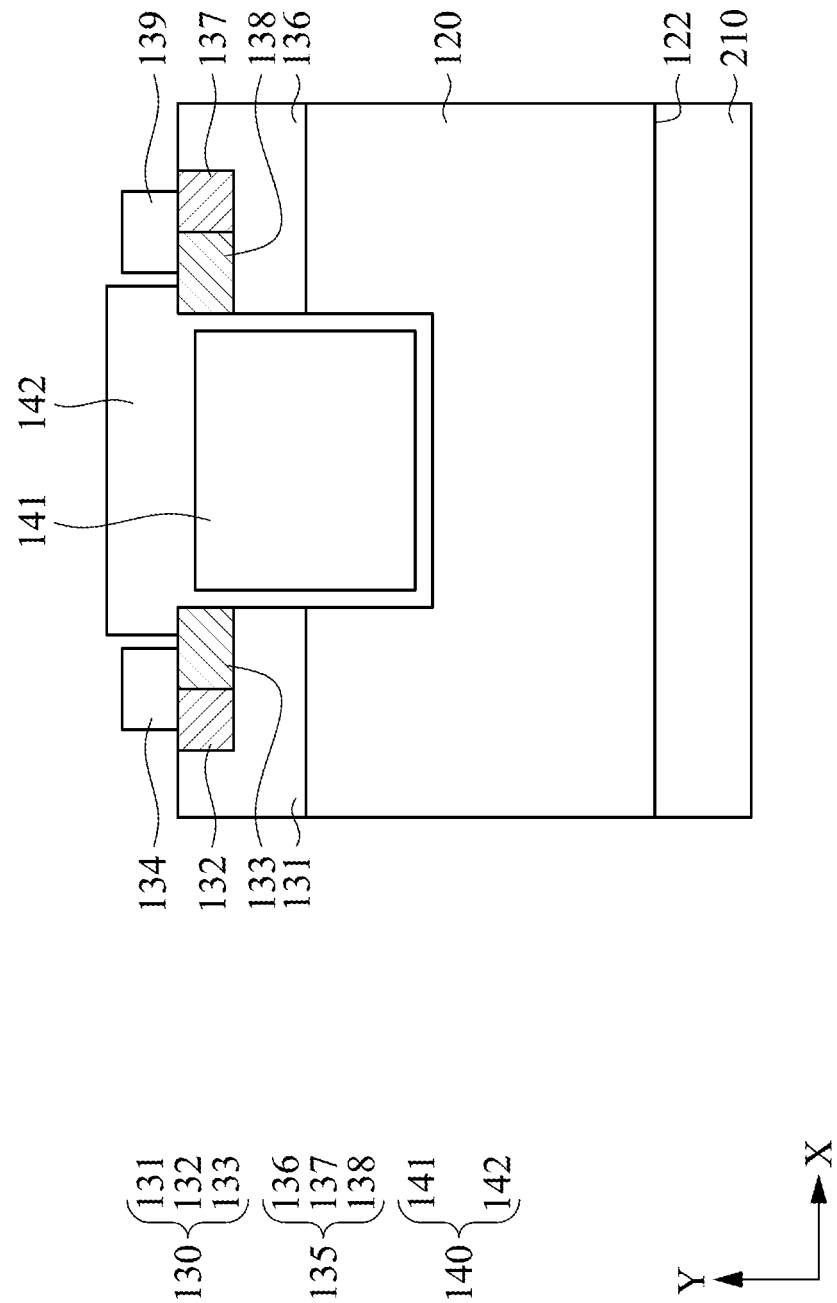

In the schematic cross-sectional view illustrated in FIG. 6, a gate structure 140 is formed in a recess 121O. As shown in FIG. 6, the gate structure 140 includes a conductive layer 141 and an oxide layer 142. The oxide layer 142 directly contacts the well 131 and the sub-doped region 133 on the sidewall 121S1 of the recess 121O. The oxide layer 142 directly contacts the well 136 and the sub-doped region 138 on the sidewall 121S2 of the recess 121O. Therefore, through the oxide layer 142, the conductive layer 141 of the gate structure 140 can be insulated from the well 131, the sub-doped region 133, the well 136 and the sub-doped region 138. In some embodiments, as shown in FIG. 6, the formed oxide layer 142 can cover a part of the sub-doped region 133 and a part of the sub-doped region 138.

Furthermore, in FIG. 6, the electrodes 134 are formed on the doped region 130. The electrodes 134 are located over the sub-doped region 132 and the sub-doped region 133 to directly contact the sub-doped region 133. In addition, the electrodes 139 are formed over the doped region 135. The electrodes 139 are located over the sub-doped region 137 and the sub-doped region 138 to directly contact the sub-doped region 138. The electrodes 139 cover the sub-doped region 137 and the sub-doped region 138 to directly contact the sub-doped region 138.

Figure 7:
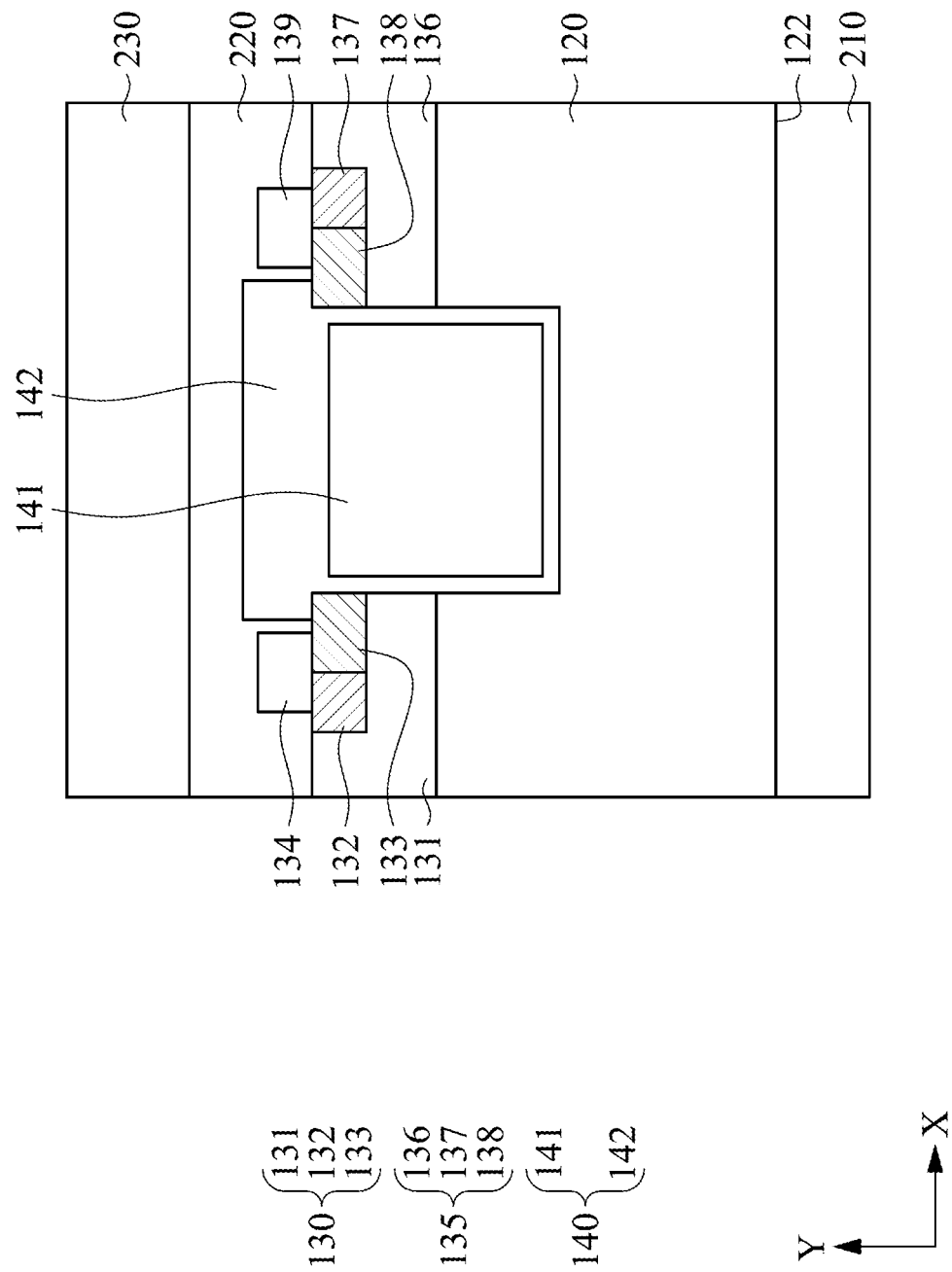

Following FIG. 6, in the schematic cross-sectional view illustrated in FIG. 7, the adhesive layer 220 is formed on top of the first side 121 of the semiconductor epitaxial layer 120 such that the well 131, the sub-doped region 132, the sub-doped region 133, the electrodes 134, the gate structure 140, the well 136, the sub-doped region 137, the sub-doped region 138, and the electrodes 139 exposed from the first side 121 of the semiconductor epitaxial layer 120 is covered by the adhesive layer 220. The adhesive layer 220 is used to further fix other additional components or layers by means of adhesion. In some embodiments, the adhesive layer 220 may include an adhesive that is sufficiently warm to withstand a certain level of temperature and facilitate removal in a subsequent process. For specific characteristics of the adhesive layer 220, see the description that follows.

Further, in the schematic cross-sectional view illustrated in FIG. 7, the semiconductor epitaxial layer 120 is fixed to the transfer substrate 230 by attaching the transfer substrate 230 to the first side 121 of the semiconductor epitaxial layer 120 through the adhesive layer 220. In some embodiments, the transfer substrate 230 is used to temporarily secure the semiconductor substrate 210, the semiconductor epitaxial layer 120, and one or more components/structures on the semiconductor epitaxial layer 120. In a subsequent process, the transfer substrate 230 can be disconnected from the semiconductor epitaxial layer 120 by removing the adhesive layer 220.

In one or more embodiments of the present disclosure, by way of example but not limitation, the transfer substrate 230 includes a sapphire substrate.

Figure 8:
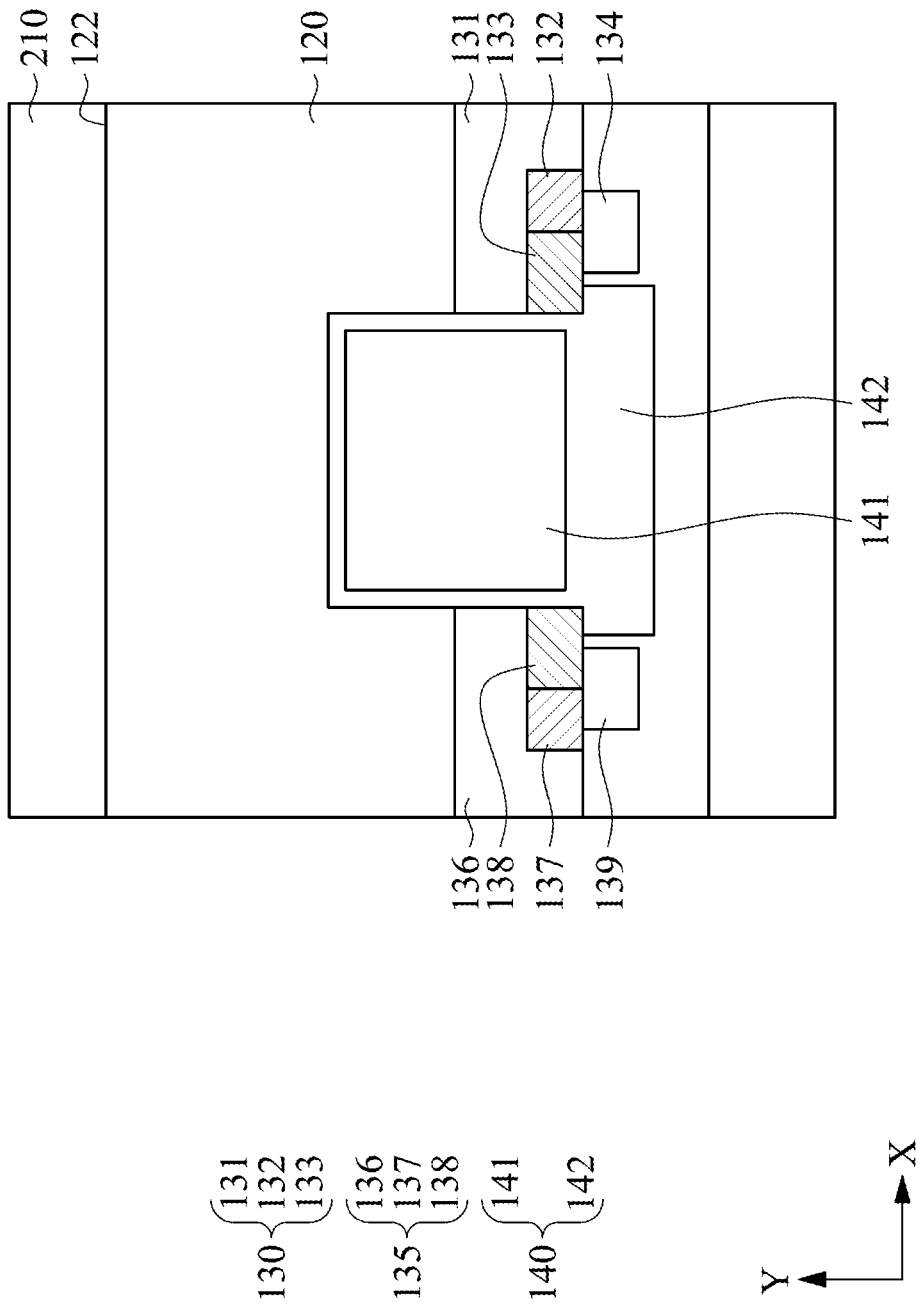

In FIG. 8, by the transfer substrate 230, it is possible to flip the semiconductor substrate 210 with the semiconductor epitaxial layer 120 so that the first side 121 of the semiconductor epitaxial layer 120 including the well 131, the sub-doped region 132, the sub-doped region 133, the electrode 134, the gate structure 140, the well 136, the sub-doped region 137, the sub-doped region 138 and the electrode 139 face down and the second side 122 of the semiconductor epitaxial layer 120 and the semiconductor substrate 210 face up upward. By setting up the transfer substrate 230, it will be possible to easily perform further semiconductor processes on the second side 122 of the semiconductor epitaxial layer 120.

Figure 9:
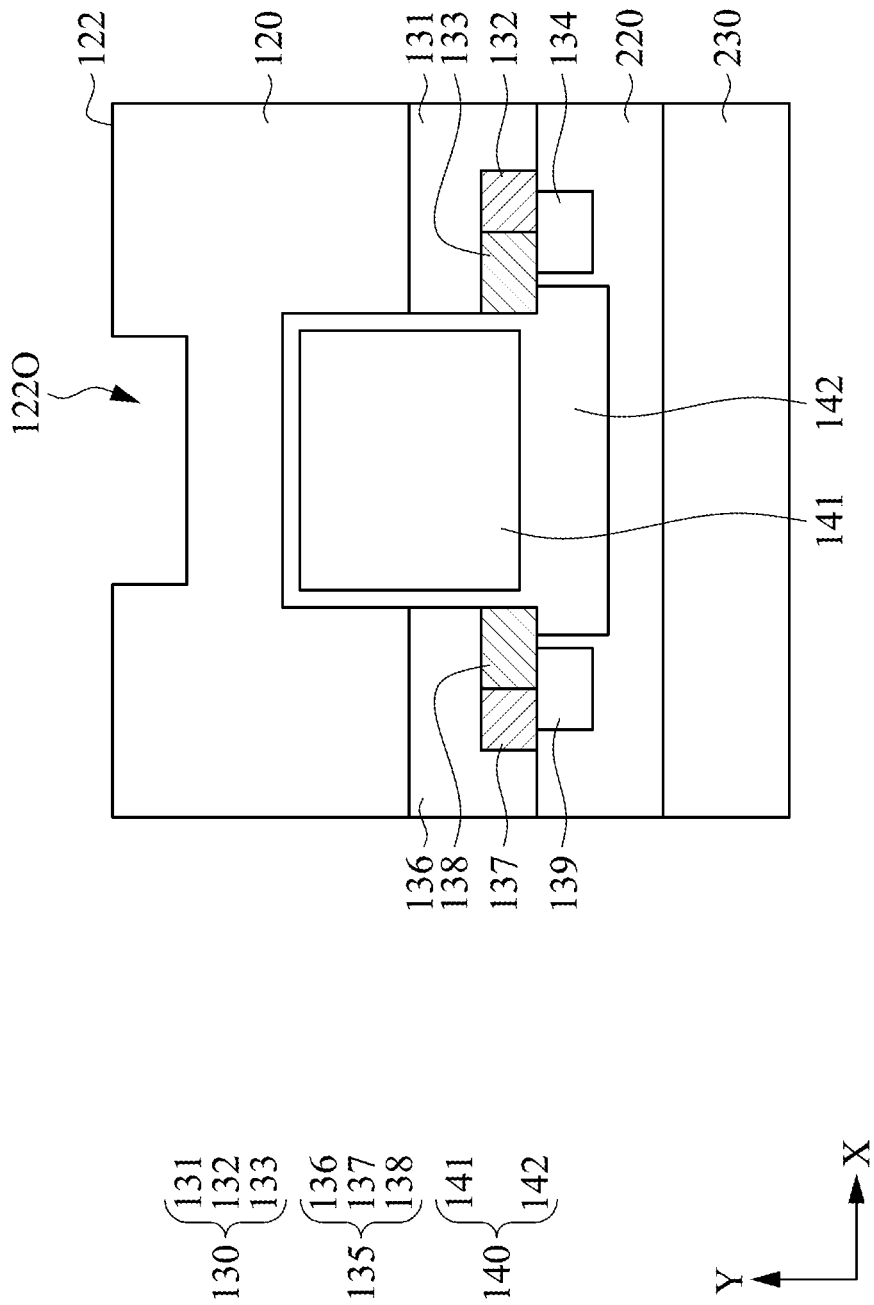

Reference is made to FIG. 9. The semiconductor substrate 210 is removed. In other words, the semiconductor substrate 210 can be considered as a temporary substrate that can be removed after the semiconductor epitaxial layer 120 is formed on the semiconductor substrate 210. After the semiconductor substrate 210 is removed, the second side 122 of the semiconductor epitaxial layer 120 is exposed.

Then, as shown in FIG. 9, a recess 1220 is formed on the second side 122 of the semiconductor epitaxial layer 120. In the embodiment illustrated in FIG. 9, the recess 1220 is recessed from the second side 122 and aligned with the gate structure 140 in the recess 121O.

Figure 10:
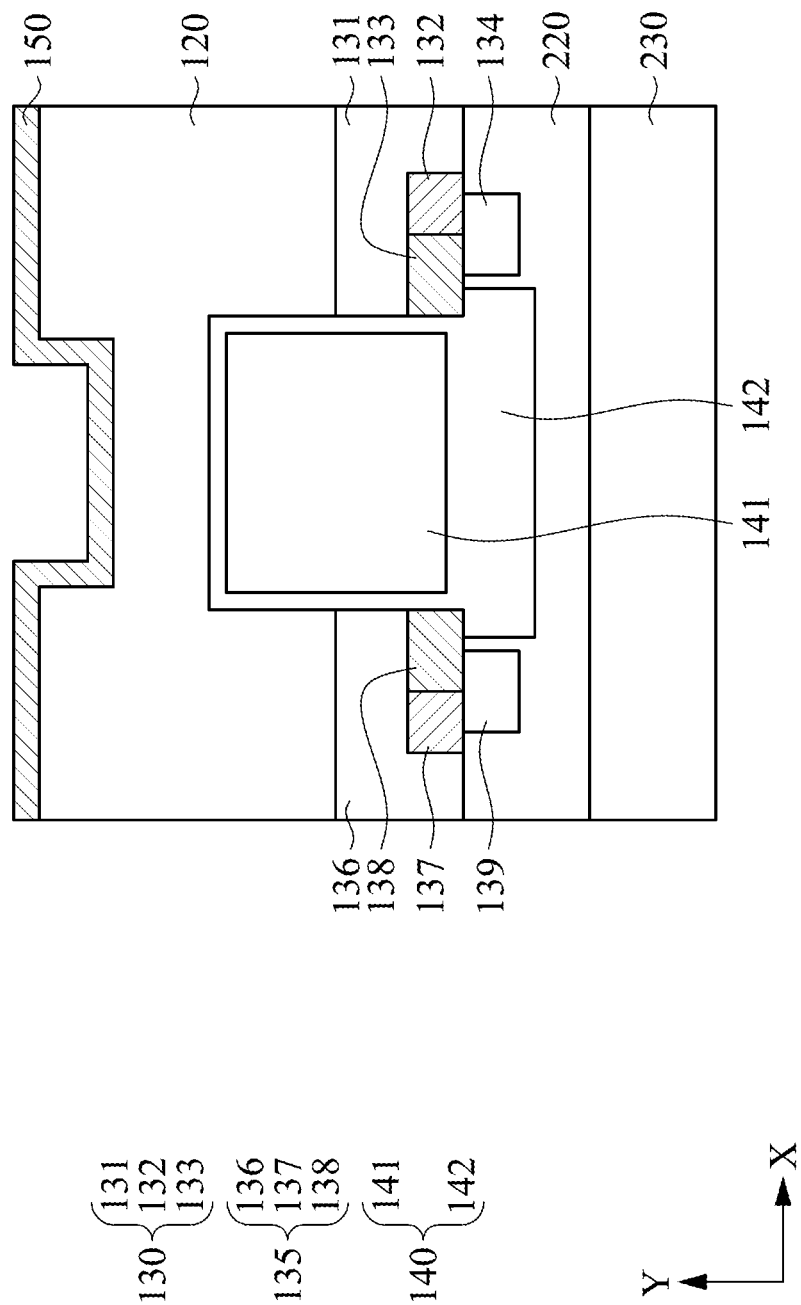

In the schematic cross-sectional view illustrated in FIG. 10, a doped region 150 is formed. The doped region 150 is formed conformally on a second side 122 of the semiconductor epitaxial layer 120 having a recess 1220. In FIG. 10, the doping process is performed on the second side 122 of the semiconductor epitaxial layer 120 while the overall thickness of the semiconductor epitaxial layer 120 remains unchanged, so that the doped region 150 has the same first semiconductor type as the semiconductor epitaxial layer 120. A doping concentration of the doped region 150 is greater than the doping concentration of the semiconductor epitaxial layer 120. In this embodiment, the semiconductor epitaxial layer 120 has an n-type doping concentration in the region outside the well 131, the well 136 and the doped region 150, and the doped region 150 has a heavily $n^+$-doping concentration greater than the semiconductor epitaxial layer 120.

Therefore, the doped region 150 can be regarded as a drain structure of the transistors. The sub-doped region 133 in the well 131 and the sub-doped region 138 in the well 136 have $n^+$-doping concentration, the well 131 and the well 136 have p-doping concentration, and the doped region 150 has $n^+$-doping concentration. Therefore, an n-p-n junction and a transistor controlled by gate structure 140 are formed. The n-type doped semiconductor epitaxial layer 120 between the well 131, the well 136 and the doped region 150 is used as a drift layer for n-type carriers (i.e., electrons) so that n-type carriers can move from the sub-doped region 133 and the sub-doped region 138 to the doped region 150 via the well 131 and the well 136, respectively. A thickness of the semiconductor epitaxial layer 120 between the doped region 150 and the gate structure 140 is reduced, and a reduction in the equivalent conduction resistance of the formed transistors is provided.

Figure 11:
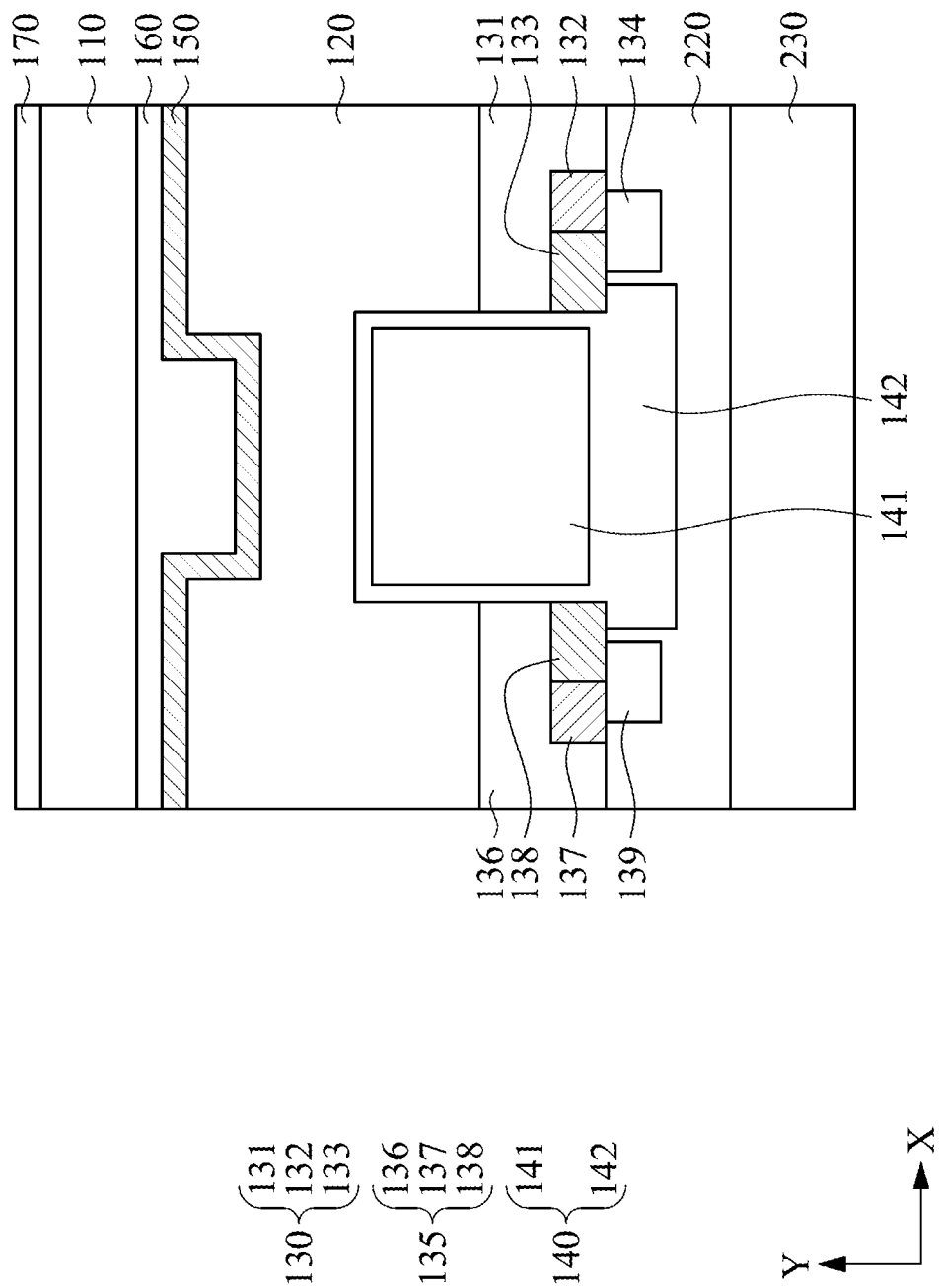

In the schematic cross-sectional view illustrated in FIG. 11, a further gate structure is formed. In detail, in this embodiment, the semiconductor substrate 110 having a heavily $n^+$-type doping concentration is bonded to the second side 122 of the semiconductor epitaxial layer 120 by a conductive layer 160. As shown in FIG. 11, the recess of the doped region 150 is filled with the conductive layer 160 and the exposed doped region 150 is covered by the conductive layer 160. The substrate 110 with $n^+$-doping concentration is subsequently bonded to the doped region 150 with $n^+$-doping concentration through the conductive layer 160 such that the doped region 150 together with the substrate 110 serves as a drain structure on the second side 122 of the semiconductor epitaxial layer 120.

In FIG. 11, a further electrode 170 is formed on a top surface exposed from the substrate 110. In one or more embodiments of the present disclosure, the conductive layer and the electrode 170 include, for example, metal layers. For example, but without limitation, in some embodiments, the material of the conductive layer 160 includes a titanium (Ti)/nickel (Ni)/silver (Ag) deposition layer.

It may be noted that during the process of forming the doped region 150, the conductive layer 160, the electrodes 170 and the bonded substrate 110 in FIG. 10 and FIG. 11, the transfer substrate 230 is always kept connected to the semiconductor epitaxial layer 120 by the adhesive layer 220.

In other words, the transfer substrate 230 and the adhesive layer 220 should be selected to withstand the high temperatures in the process of forming the doped region 150, the conductive layer 160, the electrodes 170 and the bonded substrate 110.

For example, in the process of forming the doped region 150, the process may include doping the semiconductor epitaxial layer 120 with a dopant and performing an annealing process to activate the implanted particles in the doped region 150. During the annealing process, the adhesive layer 220 and the transfer substrate 230 would likely be disposed under a temperature over 1000° C., so the adhesive layer 220 and the transfer substrate 230 are made of materials that can withstand temperatures in excess of 1000° C. In some embodiments, the material of the semiconductor epitaxial layer 120 is silicon carbide, and the implanted ions doped into the semiconductor epitaxial layer 120 may be activated/annealed at an operating temperature of more than 1700° C., in which case the adhesive layer 220 and the transfer substrate 230 are made of a material capable of withstanding a temperature of more than 1700° C. In some embodiments, the transfer substrate 230 may be a sapphire substrate.

Figure 12:
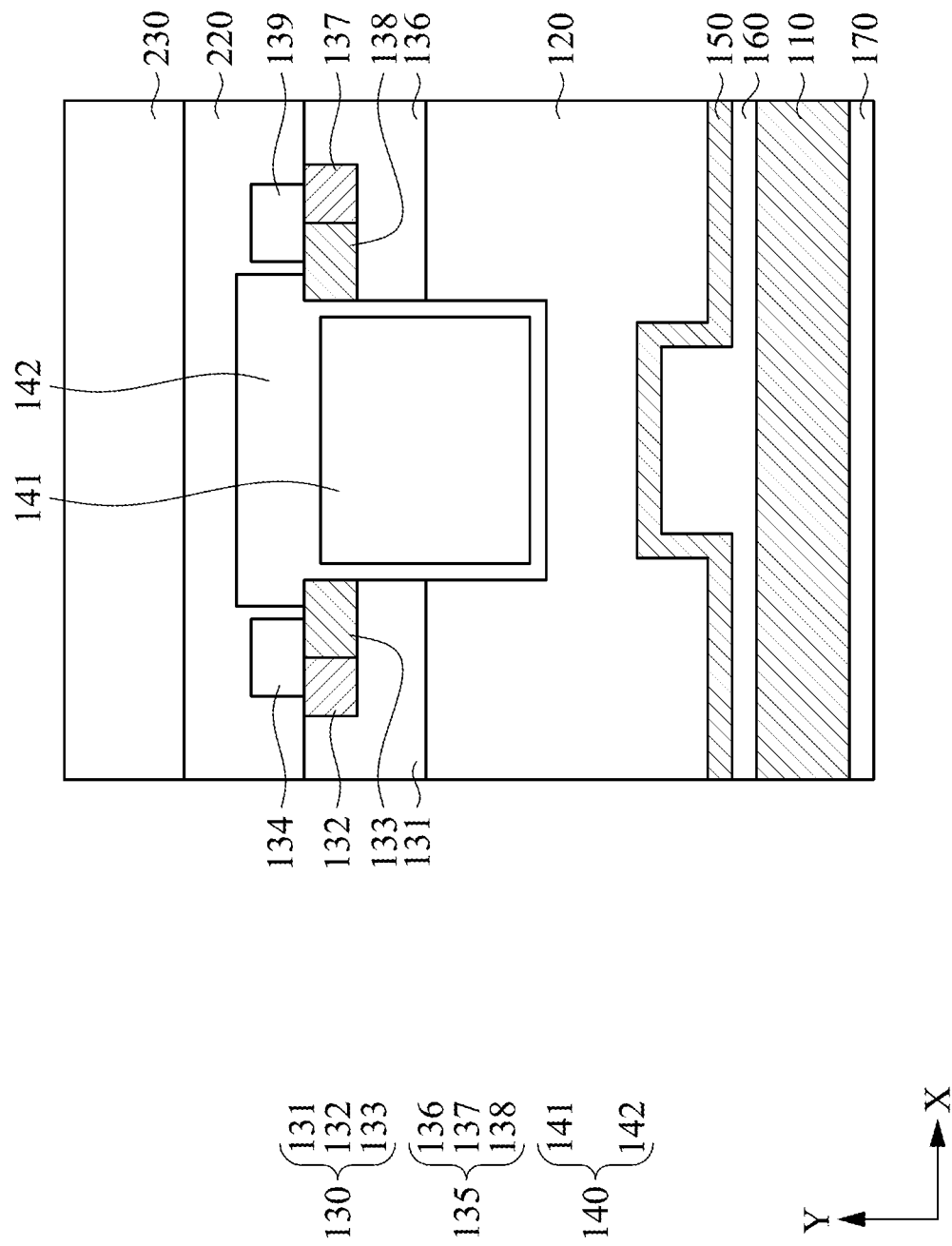

After the doped region 150 and the conductive layer 160 are formed, the substrate 110 is bonded and the electrode 170 is formed on the substrate 110, proceed to FIG. 12. In the schematic cross-sectional view illustrated in FIG. 12, the semiconductor epitaxial layer 120 and the newly bonded substrate 110 are flipped by the transfer substrate 230 such that the first side 121 of the semiconductor epitaxial layer 120 faces up and the second side 122 of the semiconductor epitaxial layer 120 faces down.

Figure 13:
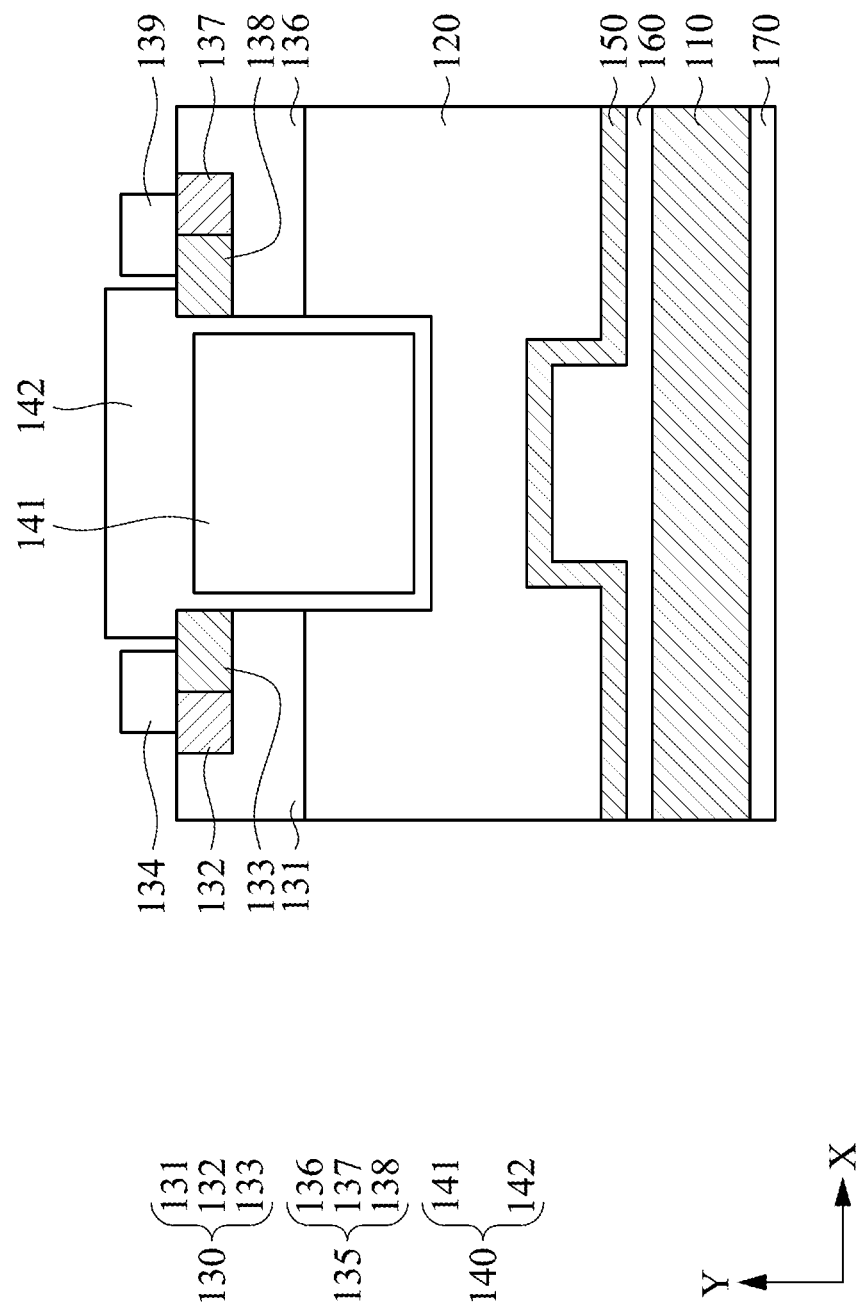

Then, in the schematic cross-sectional view illustrated in FIG. 13, the adhesive layer 220 and the transfer substrate 230 are removed to form the semiconductor structure 100. The formed semiconductor structure 100 includes a transistor formed by the semiconductor epitaxial layer 120, the doped region 130, the doped region 135, the gate structure 140 and the doped region 150. The doped region 150 is connected to the substrate 110 through the conductive layer 160 to form a further electrode structure. The electrode 134 and electrode 139 are formed on top of the doped region 130 and doped region 135 respectively as source electrodes. The electrode 170 can be a metal layer formed under the substrate 110 as a drain electrode.

Figure 14:
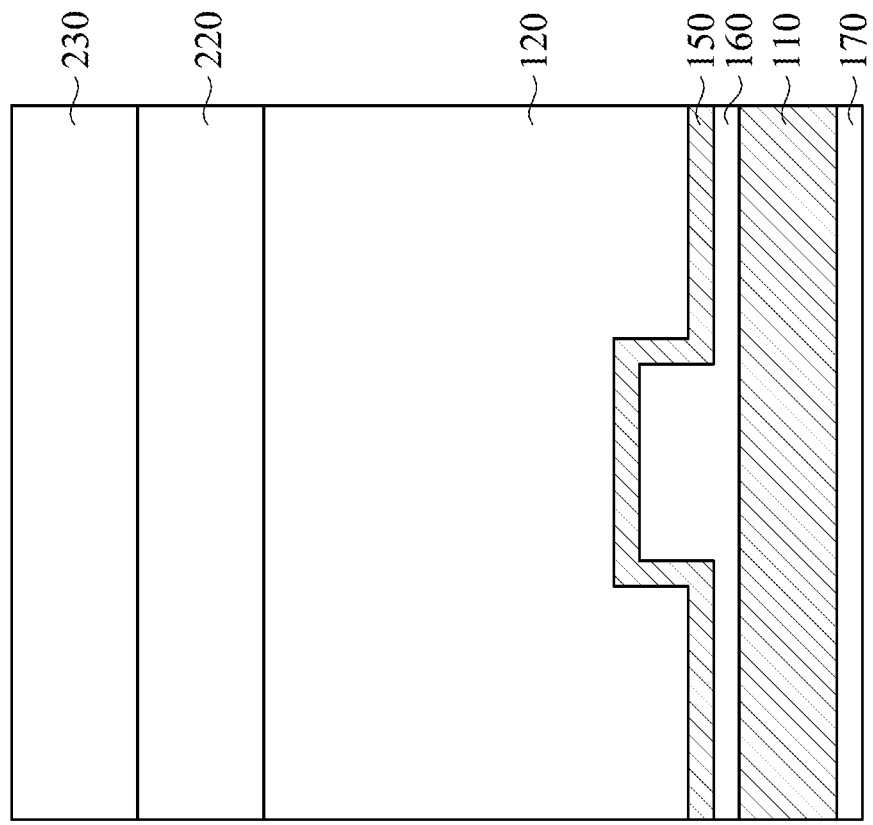
Figure 16:
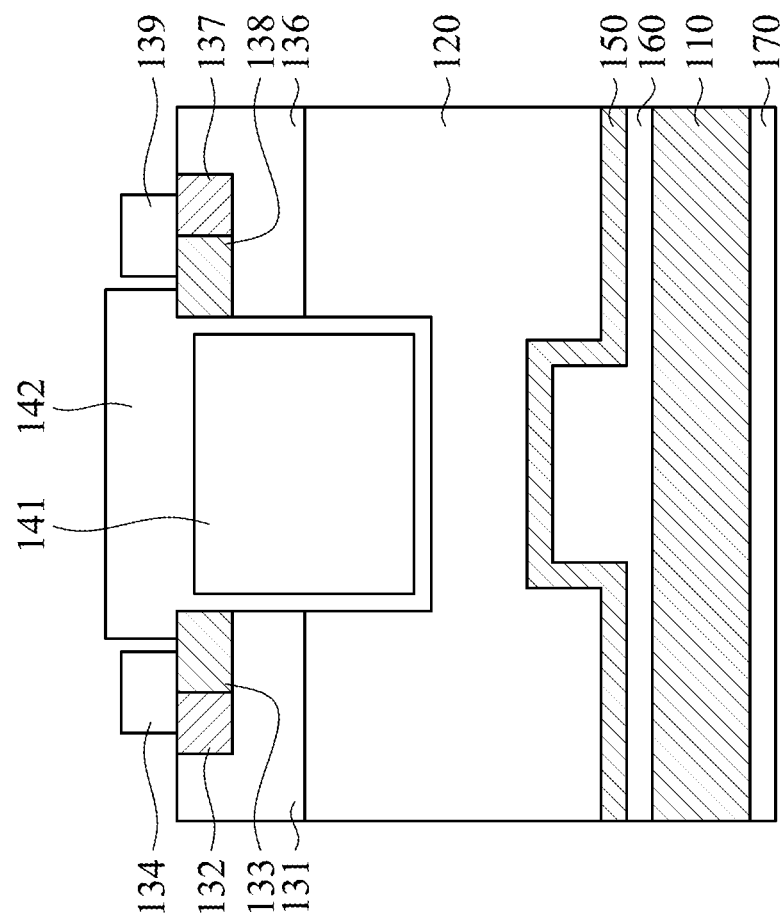

Reference is made to FIGS. 14-16. FIGS. 14-16 schematically illustrate cross-section views of one or more middle operations of forming a semiconductor structure 100 according to one or more embodiment of the present disclosure.

In the process illustrated in FIG. 14, the further structure is formed on the first side 121 of the semiconductor epitaxial layer 120 after the doped region 150, the conductive layer 160, the substrate 110 and the electrode 170 are formed on the second side 122 of the semiconductor epitaxial layer 120. Therefore, during the process of forming the doped region 150, the conductive layer 160, the substrate 110 and the electrode 170 on the second side 122 of the semiconductor epitaxial layer 120, the adhesive layer 220 and the transfer substrate 230 remain connected to the first side 121 of the semiconductor epitaxial layer 120. In one or more embodiments of the present disclosure, it is possible to flip the semiconductor epitaxial layer 120 by the transfer substrate 230, so that the second side 122 of the semiconductor epitaxial layer 120 faces upward. As shown in FIG. 14, the doped region 150, the conductive layer 160, the substrate 110 and the electrode 170 is formed on the second side 122 of the semiconductor epitaxial layer 120 and then the semiconductor epitaxial layer 120 is flipped back by the transfer substrate 230.

Subsequently, in FIG. 15, the adhesive layer 220 and the transfer substrate 230 are removed. Following FIG. 15, in FIG. 16, a well 131, a sub-doped region 132, a sub-doped region 133, an electrode 134, a gate structure 140, a well 136, a sub-doped region 137, a sub-doped region 138, a well 136 and an electrode are formed on the first side 121 of the semiconductor epitaxial layer, and the semiconductor structure 100 is formed. The well 131, the sub-doped region 132, the sub-doped region 133, the electrode 134, the gate structure 140, the well 136, the sub-doped region 137, the sub-doped region 138 and the electrode 139 can be formed by the processes similar to process illustrated in FIGS. 4-6.

In some embodiments, the electrode 134, the electrode 139 and the electrode 170 may be formed after the adhesive layer 220 and the transfer substrate 230 is removed, and the number of semiconductor manufacturing processes experienced by the adhesive layer 220 and the transfer substrate 230 can be reduced.

By disposing the transfer substrate 230, it is advantageous to perform different semiconductor processes on the first side 121 and the second side 122 of the semiconductor epitaxial layer 120, respectively. Therefore, the semiconductor process can be conveniently performed on the first side 121 and the second side 122 of the semiconductor epitaxial layer 120 through the transfer substrate 230, and the first side 121 and the second side 122 opposite to the first side 121 of the semiconductor epitaxial layer 120 can be effectively utilized to improve electrical properties. For example, the on-resistance of a transistor in the semiconductor structure can be improved by aligning the recessed doped regions 150 at the second side 122 with the gate structure at the first side 121.

Figure 17:
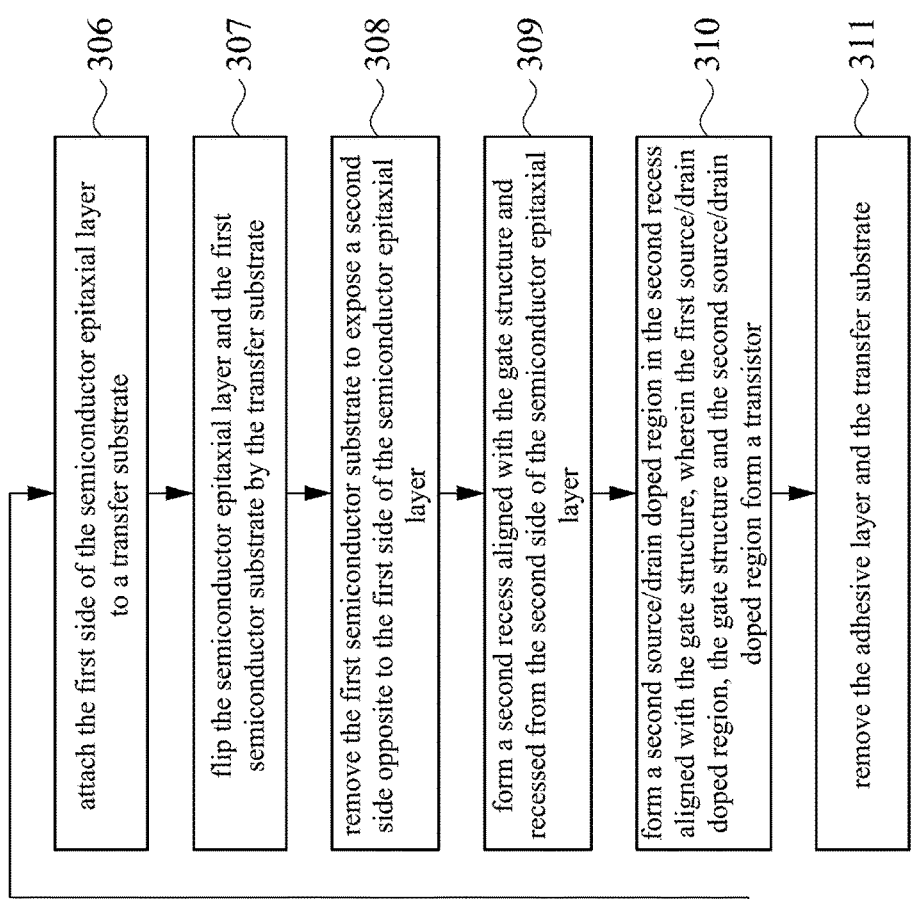
FIG. 17 illustrates a flow chart of a method of forming a semiconductor structure according to one or more embodiments of the present disclosure.
Figure 17:
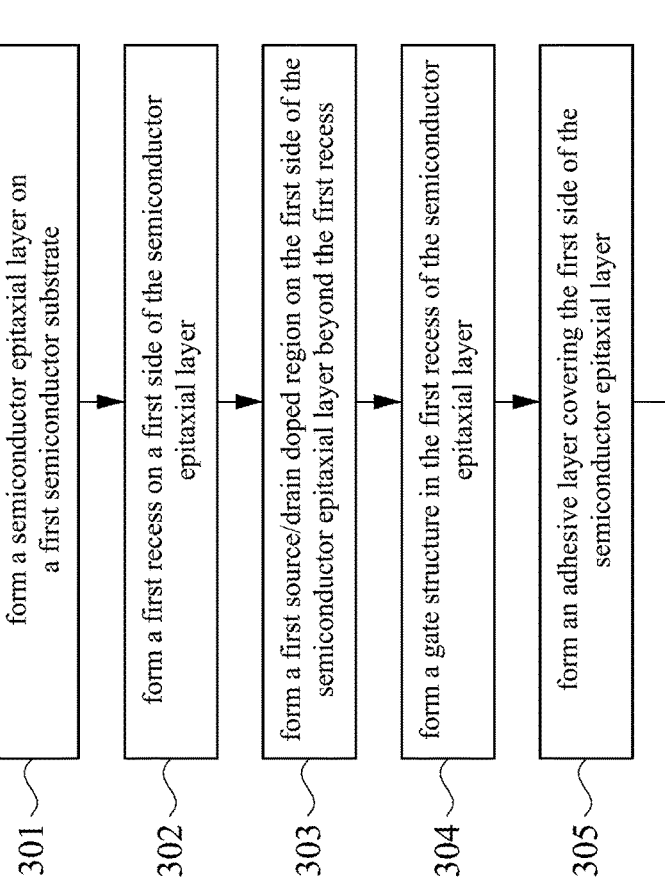

Reference is made to FIG. 17. FIG. 17 illustrates a flow chart of a method 300 of forming a semiconductor structure 100 according to one or more embodiments of the present disclosure.

Referring to FIGS. 2 and 3, in operation 301, a first semiconductor substrate 210 is provided and a semiconductor epitaxial layer 120 on a first semiconductor substrate 210.

Referring to FIG. 4, in operation 302, a first recess 121O is formed on a first side 121 of the semiconductor epitaxial layer 120.

Referring to FIG. 5, in operation 303, first source/drain doped regions 130 and 135 are on the first side 121 of the semiconductor epitaxial layer 120 outside the first recess 121O. In one or more embodiments, the doped region 130 and the doped region 135 are used as sources.

Referring to FIG. 6, in operation 304, a gate structure 140 is formed in the first recess 121O of the semiconductor epitaxial layer 120. In some embodiments, after the gate structure 140 is formed, electrodes 134 and 139 can be further formed on the doped region 130 and 135, respectively.

Referring to FIG. 7, in operation 305, an adhesive layer 220 covering the first side 121 of the semiconductor epitaxial layer 120 is formed.

Referring to FIG. 7, in operation 306, the first side 121 of the semiconductor epitaxial layer 120 is fixed on a transfer substrate 230. In this embodiment, the semiconductor epitaxial layer 120 is attached to the transfer substrate 230 by the adhesive layer 220.

Referring to FIG. 8, in operation 307, the semiconductor epitaxial layer 120 and the first semiconductor substrate 110 are flipped by the transfer substrate 230.

Referring to FIG. 9, in operation 308, the first semiconductor substrate 110 is removed to expose a second side 122 opposite to the first side 121 of the semiconductor epitaxial layer 120. Then, in operation 309, a second recess 122O aligned with the gate structure 140 and recessed from the second side 122 of the semiconductor epitaxial layer 120 is formed.

Referring to FIG. 10, in operation 310, a second source/drain doped region 150 is formed in the second recess 122O aligned with the gate structure 140, wherein the first source/drain doped region 130, the gate structure 140 and the second source/drain doped region 150 form a transistor, and the first source/drain doped region 135, the gate structure 140 and the second source/drain doped region 150 form another transistor. In one or more embodiments, the doped region 150 can be used as a drain of the transistors. In some embodiments, as shown in FIG. 11, a conductive layer 160 can be further connected to the doped region 150 to form further drain structures.

Referring to FIGS. 12 and 13, in operation 311, the semiconductor epitaxial layer 120 and the substrate 110 are flipped by the transfer substrate, and then the adhesive layer 220 and the transfer substrate 230 are removed.

In one or more embodiments of the present disclosure, the doped region 150 can also be formed on the second side 122 of the semiconductor epitaxial layer 120, and then other elements may be formed on the first side 121 of the semiconductor epitaxial layer 120. Reference is made to FIGS. 14-16. In other words, in some embodiments, operation 302 to operation 304 may be performed following operation 311.

In summary, by decreasing the distance between the gate structure in the semiconductor epitaxial layer and the doped region used as a drain, the on-resistance of the semiconductor structure can be reduced, and the dimensional relationship to the components except for the doped region used as the drain and the gate structure would not change, so that it avoids generations of unintended leakage currents at the locations in the semiconductor structure outside the location between the doped region used as the drain and the gate structure. By using the transfer substrate in the semiconductor process, it will be possible to flexibly perform the semiconductor process on the opposite first side and the second side of the semiconductor epitaxial layer to form a structure to be required.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this disclosure provided they fall within the scope of the following claims.

What is claimed is:
1. A method of forming a semiconductor structure comprising:
forming a semiconductor epitaxial layer on a first semiconductor substrate;

forming an adhesive layer covering a first side of the semiconductor epitaxial layer;
fixing the first side of the semiconductor epitaxial layer on a transfer substrate by the adhesive layer covering the first side of the semiconductor epitaxial layer;
flipping the semiconductor epitaxial layer and the first semiconductor substrate;
removing the first semiconductor substrate to expose a second side of the semiconductor epitaxial layer opposite to the first side;
forming a first doped region on the second side of the semiconductor epitaxial layer;
forming a conductive layer on the second side of the semiconductor epitaxial layer;
connecting a second semiconductor substrate to the conductive layer;
forming a metal layer on the second semiconductor substrate; and
removing the adhesive layer and the transfer substrate.

2. The method of claim 1, further comprising:
before the adhesive layer covering the first side of the semiconductor epitaxial layer is formed or after the adhesive layer and the transfer substrate is removed, forming a second doped region on the first side of the semiconductor epitaxial layer.

3. The method of claim 1, further comprising:
forming a first recess on the first side of the semiconductor epitaxial layer;
forming a second doped region on the first side of the semiconductor epitaxial layer outside the first recess; and
forming a gate structure in the first recess, wherein the first doped region, the gate structure and the second doped region form a transistor.

4. The method of claim 3, further comprising:
forming a second recess recessed from the second side of the semiconductor epitaxial layer and aligned with the first recess; and
forming the first doped region in the second recess.

5. The method of claim 4, wherein the conductive layer is filled in the second recess.

6. The method of claim 1, further comprising:
forming a second doped region on the first side of the semiconductor epitaxial layer;
forming a first electrode on the first doped region; and
before the adhesive layer covering the first side of the semiconductor epitaxial layer is formed or after the adhesive layer and the transfer substrate is removed, forming a second electrode on the second doped region.

7. A method of forming a semiconductor structure, comprising:
forming a semiconductor epitaxial layer on a first semiconductor substrate;
forming a first recess on a first side of the semiconductor epitaxial layer;
forming a gate structure in the first recess of the semiconductor epitaxial layer;
forming a first source/drain doped region on the first side of the semiconductor epitaxial layer outside the first recess;
forming an adhesive layer covering the first side of the semiconductor epitaxial layer;
fixing the first side of the semiconductor epitaxial layer on a transfer substrate by the adhesive layer;
flipping the semiconductor epitaxial layer and the first semiconductor substrate;
removing the first semiconductor substrate to expose a second side of the semiconductor epitaxial layer opposite of the first side;
forming a second recess recessed from the second side of the semiconductor epitaxial layer and aligned with the gate structure;
forming a second source/drain doped region in the second recess aligned with the gate structure, wherein the first source/drain doped region, the gate structure and the second source/drain doped region form a transistor;
filling a conductive layer in the second recess;
connecting a second semiconductor substrate to the conductive layer;
forming a metal layer on the second semiconductor substrate; and
removing the adhesive layer and the transfer substrate.

8. The method of claim 7, further comprising:
before the transfer substrate is removed, forming an electrode layer covering the second source/drain doped region.

9. The method of claim 7, further comprising:
before the adhesive layer is formed, forming an electrode on the first source/drain doped region, wherein forming the adhesive layer comprises the electrode is covered by the adhesive layer.

10. The method of claim 7, further comprising:
before the transfer substrate is removed, forming an electrode on the first source/drain doped region.

11. The method of claim 7, further comprising:
forming another first source/drain doped region on the first side of the semiconductor epitaxial layer, wherein the two first source/drain doped regions are respectively formed on two opposite sidewalls of the first recess.

12. The method of claim 7, wherein forming the first source/drain doped region comprising:
forming a semiconductor well on the first side of the semiconductor epitaxial layer outside the first recess; and
forming a first sub-doped region with a first semiconductor type and a second sub-doped region with a second semiconductor type in the semiconductor well, wherein the first semiconductor type is different from the second semiconductor type.

13. The method of claim 7, wherein the first semiconductor substrate is a silicon carbide substrate, and the transfer substrate is a sapphire substrate.

* * * * *